United States Patent [19]

Tanaka

[11] Patent Number: 5,473,191

[45] Date of Patent: Dec. 5, 1995

[54] HYBRID INTEGRATED CIRCUIT DEVICE WITH APERTURED COVER

[75] Inventor: Katsunori Tanaka, Hyogo, Japan

[73] Assignee: Mitsubishi Denki Kabushiki Kaisha, Tokyo, Japan

[21] Appl. No.: 314,620

[22] Filed: Sep. 29, 1994

[30] Foreign Application Priority Data

Feb. 16, 1994 [JP] Japan ................................. 6-019435

[51] Int. Cl.⁶ .......................... H01L 23/02; H01L 23/22; H01L 23/48; H01L 23/12
[52] U.S. Cl. ................ 257/680; 257/687; 257/688; 257/704; 257/787
[58] Field of Search ............................ 257/787, 680, 257/687, 688, 704

[56] References Cited

FOREIGN PATENT DOCUMENTS 52-3647  1/1977  Japan ................................. 257/787
63-117454 5/1988  Japan ................................. 257/680

*Primary Examiner*—Steven H. Loke
*Attorney, Agent, or Firm*—Sughrue, Mion, Zinn, Macpeak and Seas

[57] ABSTRACT

A hybrid integrated circuit device is constructed by injecting a protective resin 10 into a ring 9 enclosing functional elements 802–804 mounted on an integrated circuit board 8, and by providing a plate-like cover member 11 having variously shaped openings 12 overlying the resin.

7 Claims, 7 Drawing Sheets

HYBRID INTEGRATED CIRCUIT DEVICE WITH APERTURED COVER

BACKGROUND OF THE INVENTION

1. Field of the Invention

This invention relates to a hybrid integrated circuit device to be used as, for example, a controller for an AC generator for a car.

2. Description of the Prior Art

FIG. 1 is a circuit diagram showing an AC generator for a car and its controller. In FIG. 1, reference numeral 1 designates an AC generator having, for example, armature coils 101 connected with one another in the three-phase star connection and a field coil 102. Reference numeral 2 designates a rectifier, for example a full wave rectifier having a rectified output terminal 201, a grounded terminal 202 and input terminals 203 connected to the outer ends of the armature coils 101, and further having diodes connected between the input terminals 203 and the rectified output terminal 201 or between the input terminals 203 and the grounded terminal 202 respectively.

Reference numeral 3 designates a voltage regulator having voltage dividing resistors 301 and 302 for detecting the voltage of the generator 1, which resistors 301 and 302 are connected in series mutually between the rectified output terminal 201 of the rectifier 2 and ground, a capacitor 308 connected between the node 301a of these voltage dividing resistors 301, 302 and ground, a Zener diode 303 the cathode of which is connected to the node 301a, a control transistor 304 the base of which is connected to the anode of the Zener diode 303 and the emitter of which is grounded, a base current supplying resistor 305 one end of which is connected to the collector of the control transistor 304, a switching device, for example a power transistor 306 the base of which is connected to the collector of the control transistor 304 and the emitter of which is Grounded and further the collector of which is connected to the rectified output terminal 201 of the rectifier 2 through the field coil 102 of the AC Generator 1, and suppression diode 307 the anode and the cathode of which are connected to the collector of the power transistor 306 and to the rectified output terminal 201 respectively.

Reference numeral 4 designates storage batteries connected between the rectified output terminal 201 of the rectifier 2 and ground, reference numeral 5 designates a key switch connected between the positive terminal of the storage batteries 4 and the base current supplying resistor 305 in the voltage regulator 3, and reference numerals 6 and 7 respectively designate a starter switch and a starter connected in series with each other and in parallel to the storage batteries 4. The rectifier 2, the voltage regulator 3, the storage batteries 4, the key switch 5, the starter switch 6 and the starter 7 compose the controller.

Next, the operation thereof will be described. In this controller, when the key switch 5 is turned on, the voltage of the storage batteries 4 is not so high as to make the Zener diode 303 conductive at this point of time, and consequently, the control transistor 304 is non-conductive. Then, a current flows from the storage batteries 4 to the base of the power transistor 306 through the base current supplying resistor 305, and consequently the power transistor 306 turns on to become conductive. As a result, a field current flows from the storage batteries 4 to the field coil 102. And, when the starter switch 6 is turned on, the starter 7 is actuated by the storage batteries 4 to be rotated, then the engine (not shown) connected to the starter 7 starts to move. The AC generator 1 is driven by the start of the moving of the engine to begin to generate electrical energy, and the output voltage of the AC generator 1 is raised.

However, when the output voltage of the AC generator 1 is lower than a predetermined value, the Zener diode 303 and the control transistor 304 is not conductive, and the power transistor 306 remains in its conductive state. Thereby, the field current flowing in the field coil 102 increases, and the output voltage of the AC generator 1 is further raised. When the output voltage of the AC generator 1 exceeds the predetermined value, the Zener diode 303 and the control transistor 304 become conductive, and the power transistor 306 becomes non-conductive. As a result, the field current decreases, and the output voltage also falls. By repeating the operation mentioned above, the output voltage of the AC generator 1 is regulated to a predetermined value by the voltage regulator 3. The capacitor 308 performs the function of smoothing the voltage detected by the dividing resistors 301 and 302.

The capacitor 308, the power transistor 306, the dividing resistors 301, 302, the Zener diode 303, the control transistor 304, the base current supplying resistor 305, the suppression diode 307 and the like of the controller are mounted on a printed board to compose a hybrid integrated circuit device.

A conventional hybrid integrated circuit device of this kind will be described with reference to FIG. 2 and FIG. 3. FIG. 2 is a perspective view of its appearance, and FIG. 3 is a longitudinal sectional view of the device shown in FIG. 2.

In FIG. 2 and FIG. 3, reference numeral 8 designates an integrated circuit board. External terminals 801 are disposed at suitable positions on it, and function elements 802, 803 and 804 are mounted on it. The function element 802 corresponds to the power transistor 306 shown in the circuit diagram of FIG. 1, and the function element 803 similarly corresponds to the dividing resistors 301, 302, the Zener diode 303, the control transistor 304, the base current supplying resistor 305, and the suppression diode 307 shown in the circuit diagram of FIG. 1, and further the function element 804 corresponds to the capacitor 308 shown in the circuit diagram of FIG. 1. Reference numeral 9 designates a ring enclosing the function elements 802, 803 and 804 on the integrated circuit board 8, and reference numeral 10 designates a protection resin (for example, silicon in a gel state) which is filled in the ring 9 so as to cover the function elements 802, 803 and 804. The protection resin 10 is injected into the ring 9 from the opening 9a of the ring.

The hybrid integrated circuit device constructed as mentioned above protects the function elements 802, 803 and 804 from the stress caused by vibrations or heat, and from moisture and so on.

Because the top part of the ring 9 of the conventional hybrid integrated circuit device is open as shown in FIGS. 2 and 3, the device has the danger of damaging the function elements 802, 803 and 804, or the danger of breaking its reed parts when a force holding down the device is imposed on the opening 9a of the ring 9 in case of handling or carrying the device in the opened state. And the device has a problem that the effect of protecting the function elements 802, 803 and 804 from the stress caused by vibrations, heat or the like, and from moisture etc. is too small in the case where the protection resin 10 exposed to the outside at the opening 9a is damaged by being scraped and so on.

SUMMARY OF THE INVENTION

In view of the foregoing, it is an object of the present invention to provide a hybrid integrated circuit device, having high reliability, the function elements of which can be protected without influencing their structures when the device is handled or carried.

It is another object of the present invention to provide a hybrid integrated circuit device the function elements of which would not be damaged by the thermal expansion of its resin in the case where the function elements are shut closely by a cover.

It is a further object of the present invention to provide a hybrid integrated circuit device to which the protection resin can be injected after disposing a cover on its ring.

It is a further object of the present invention to provide a hybrid integrated circuit device the function elements of which are not influenced by the force imposed from the outside and the resin surface of which is not scraped even if an external force is imposed on the device.

It is a further object of the present invention to provide a hybrid integrated circuit device the function elements of which are scarcely influenced by the thermal stress of its protection resin in the case where a cover is disposed.

It is a further object of the present invention to provide a hybrid integrated circuit device the number of whose parts does not increase and which can be constructed cheaply in the case where a cover is disposed.

It is a further object of the present invention to provide a hybrid integrated circuit device which is easily built in, in case of being used in a built in state to a voltage regulator for a motor car.

According to the first aspect of the present invention, for achieving the above-mentioned objects, there is provided a hybrid integrated circuit device provided with an opened cover on its ring enclosing its function elements.

As stated above, the hybrid integrated circuit device according to the first aspect of the present invention is provided with an opened cover on its ring, and consequently, the device can be protected from influence from the outside on the top part of the ring in case of being handled and being carried. And, because the opened cover has an opening, the function element can be protected from damage due to the thermal expansion of its resin in the case where the function element is shut closely with the cover, and further its protection resin can be injected after the cover is disposed on the ring. Besides, the influence on the function element due to the thermal stress of the protection resin is small.

According to the second aspect of the present invention, there is provided a hybrid integrated circuit device the opened cover of which is a planar member provided with plural polygonal apertures.

According to the third aspect of the present invention, there is provided a hybrid integrated circuit device the polygonal apertures of the opened cover of which are triangular apertures.

According to the fourth aspect of the present invention, there is provided a hybrid integrated circuit device the polygonal apertures of the opened cover of which are rectangular apertures.

According to the fifth aspect of the present invention, there is provided a hybrid integrated circuit device the opened cover of which is a planar member provided with plural circular or elliptical apertures.

As stated above, the hybrid integrated circuit device according to the second to the fifth aspect of the present invention has an opened cover being a planar member provided with plural apertures having various shapes, and consequently, the cover resists the external force to prevent the influence of the force to the function element of the device in the case where the external force is imposed on the device, and further the resin surface in the device has no possibility of being scraped by the force.

According to the sixth aspect of the present invention, there is provided a hybrid integrated circuit device the opened cover of which is constructed in one body with the ring of the device.

As stated above, the opened cover of the hybrid integrated circuit device according to the sixth aspect of the present invention is constructed in one body with the ring, and consequently, the number of the parts of the device does not increase, and the device can be constructed cheaply.

According to the seventh aspect of the present invention, there is provided a hybrid integrated circuit device enclosed in a case of a voltage regulator for a motor car with a resin.

As stated above, the hybrid integrated circuit device according to the seventh aspect of the present invention is enclosed in the case of a voltage regulator for a motor car with a resin, and consequently, the number of the parts of the device does not increase in case of mounting the device in a motor car, and the device can be constructed cheaply, and further the device can easily be built in.

The above and further objects and novel features of the present invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Preferred embodiments of the present invention will now be described in detail with reference made to the accompanying drawings.

EMBODIMENT 1

Figure 1:
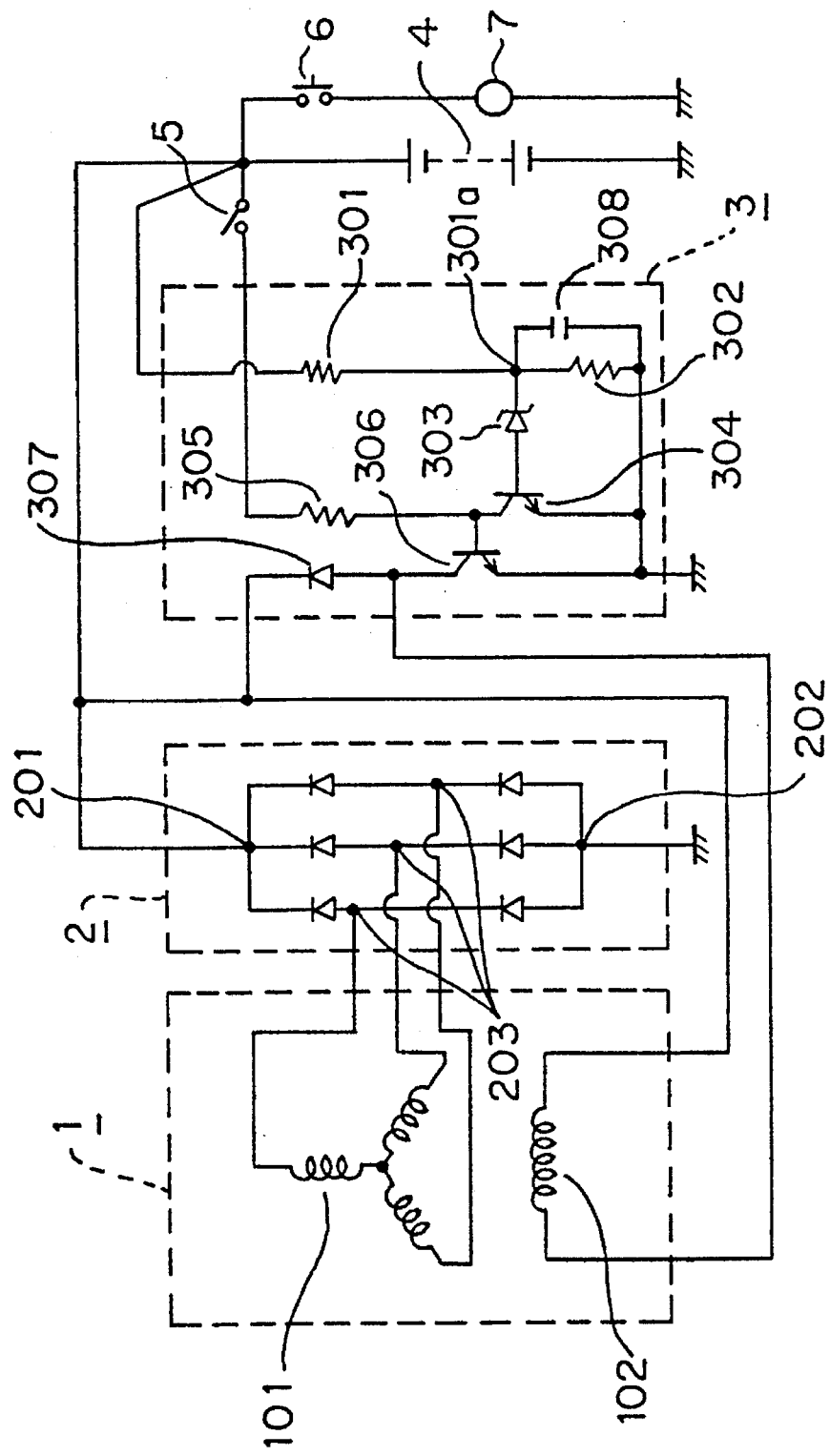
FIG. 1 is a circuit diagram showing a conventional AC generator for a motor car and its controller.
Figure 2:
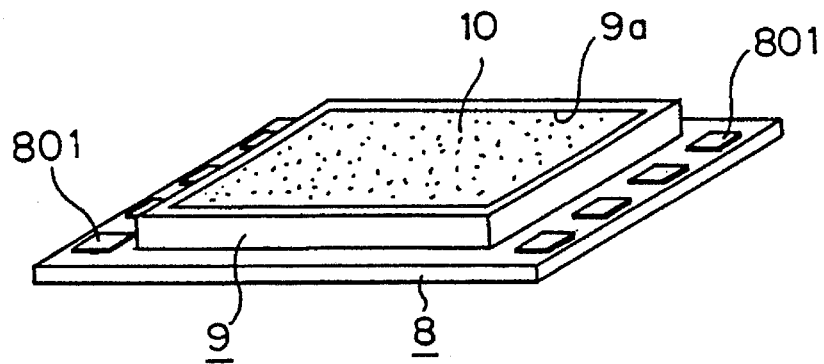
FIG. 2 is a perspective view of a conventional hybrid integrated circuit device.
Figure 3:
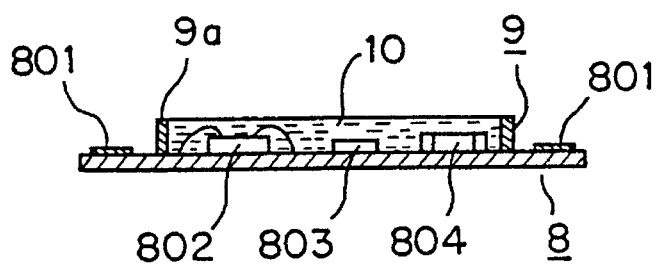
FIG. 3 is a longitudinal sectional view of the conventional hybrid integrated circuit device shown in FIG. 2.
Figure 4:
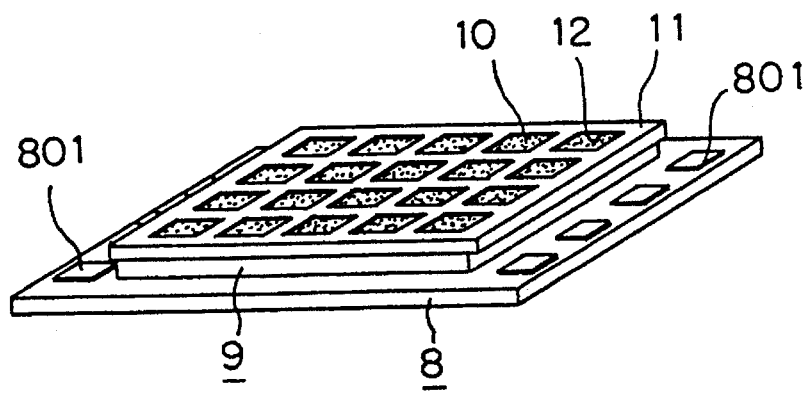
FIG. 4 is a perspective view of a hybrid integrated circuit device of embodiment 1 of the present invention.
Figure 5:
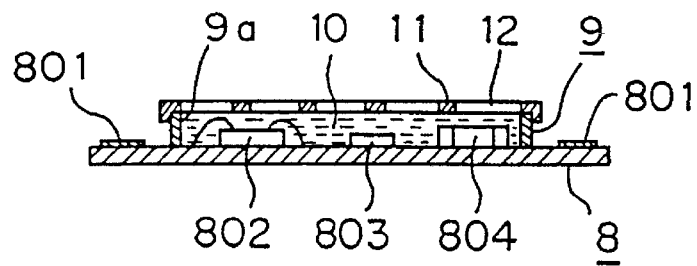
FIG. 5 is a longitudinal sectional view of the hybrid integrated circuit device shown in FIG. 4.

An embodiment of a hybrid integrated circuit device of the present invention will be described with reference to FIG. 4 and FIG. 5, wherein parts corresponding to the parts of the conventional hybrid integrated circuit shown in FIG. 2 and FIG. 3 are denoted by the same reference numerals, and the description thereof will be omitted. In FIGS. 4 and 5, reference numeral 11 designates an opened or apertured cover disposed on the ring 9 so as to close up the opening 9a of the ring 9. The opened cover 11 is shaped as a grid which is a plate-state member having plural rectangular openings. Reference numeral 12 designates the rectangular openings.

In the case where the opened cover 11 is disposed on the ring 9 after filling the protection resin 10, the function devices 802, 803 and 804 are protected from being damaged by the thermal expansion of the protection resin 10 in case of being sealed up by the opened cover 11, since the openings 12 provide expansion space.

Besides, since the protection resin 10 can be injected into the ring 9 through the openings 12 of the opened cover 11 disposed on the ring 9, the opened cover 11 can be disposed on the ring 9 before filling the protection resin 10 inside the ring 9. Thereby, the efficiency of the work is improved.

The hybrid integrated circuit device constructed as mentioned above is protected by the opened cover 11 from an external force imposed on the opened cover 11 when the device is handled or carried, and consequently, the function elements 802, 803 and 804 are not influenced by the force, and the resin surface has no possibility of being scraped by the external force because of being protected by the opened cover 11. Furthermore, because the top of the ring 9 is made in the grid-like construction being in an almost opened state, the influence of the thermal stress of the protection resin 10 to the function elements 802, 803 and 804 is not larger than that of the conventional construction.

EMBODIMENT 2

Figure 6:
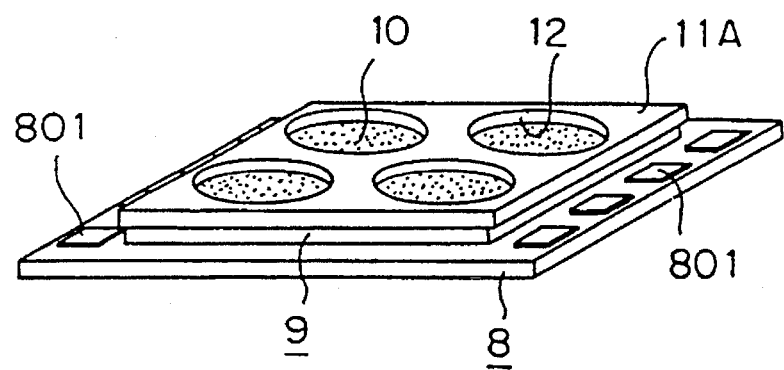
FIG. 6 is a perspective view of a hybrid integrated circuit device of embodiment 2 of the present invention.
Figure 7:
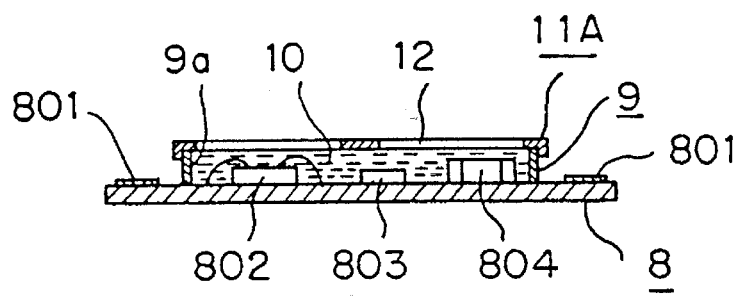
FIG. 7 is a longitudinal sectional view of the hybrid integrated circuit device shown in FIG. 6.
Figure 8:
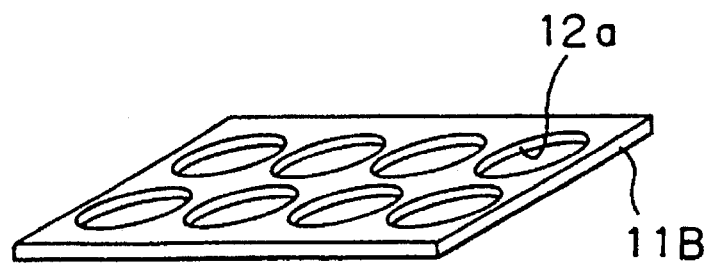
FIG. 8 is a perspective view of an opened cover of the hybrid integrated circuit device of embodiment 2 of the present invention.
Figure 9:
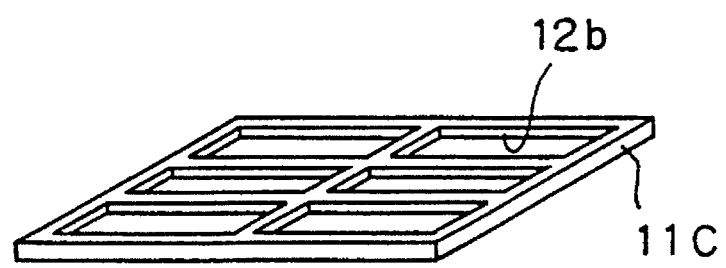
FIG. 9 is a perspective view of another opened cover of the hybrid integrated circuit device of embodiment 2 of the present invention.
Figure 10:
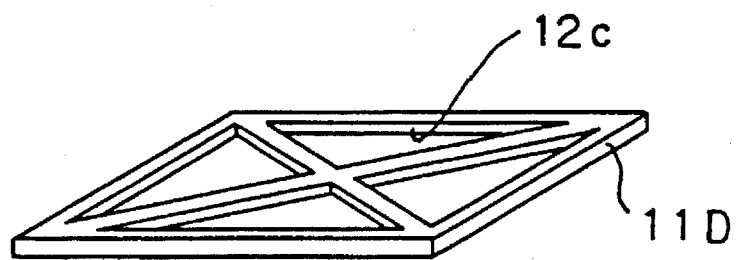
FIG. 10 is a perspective view of a different opened cover of the hybrid integrated circuit device of embodiment 2 of the present invention.

Although the grid-like plate-state member was shown as the opened cover 11 in the embodiment described above, the shape of the opened cover 11 is not restricted to the grid-like shape. For example, the following opened covers may be applicable: the opened cover 11A having four circular openings 12 as shown in FIG. 6 and FIG. 7, the opened cover 11B having eight elliptical openings 12a as shown in FIG. 8, the opened cover 11C having six rectangular openings 12b as shown in FIG. 9, and the opened cover 11D having four triangular openings 12c as shown in FIG. 10.

EMBODIMENT 3

Figure 11:
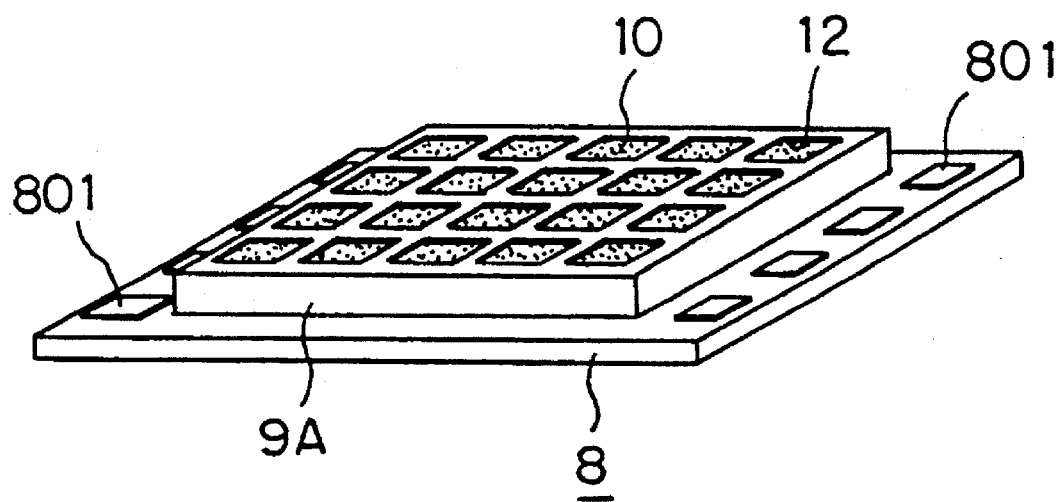
FIG. 11 is a perspective view of the hybrid integrated circuit device of embodiment 3 of the present invention.
Figure 12:
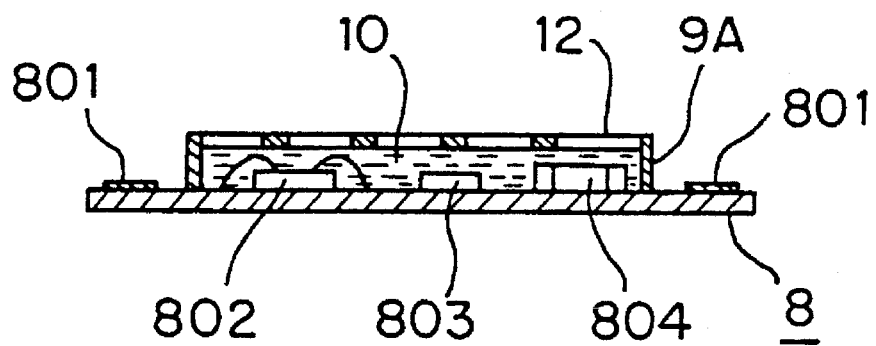
FIG. 12 is a longitudinal sectional view of the hybrid integrated circuit device shown in FIG. 11.

Although the opened covers 11, 11A, 11B, 11C and 11D separated from the ring 9 were shown as planar members, the opened covers may be formed as shallow, box-like bodies together with the ring 9. If an opened cover is made as a ring 9A having a ceiling provided with plural rectangular openings, for example, as shown in FIG. 11 and FIG. 12, the number of parts of the device and its attendant cost decrease, in addition to retaining the effects obtained in embodiments 1 and 2. In this case, the protection resin 10 is injected through the openings 12 of the ring 9A.

EMBODIMENT 4

A case where each hybrid integrated circuit device of the aforementioned embodiments 1–3 is fixed in the case of a voltage regulator for a motor car by filling resin into the case will be described with reference to FIG. 13 and FIG. 14.

Figure 13:
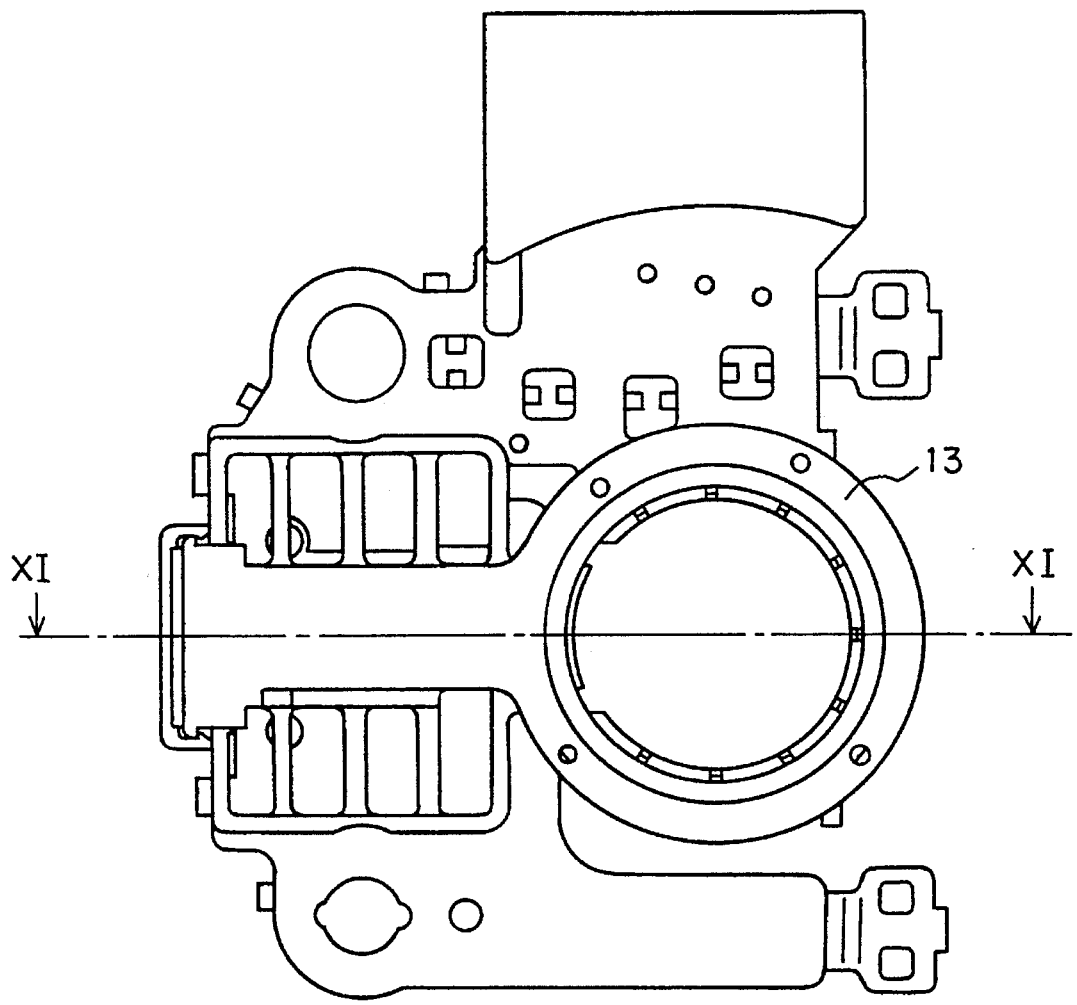
FIG. 13 is a front view showing a regulator case in which the hybrid integrated circuit device of embodiment 4 of the present invention is mounted.
Figure 14:
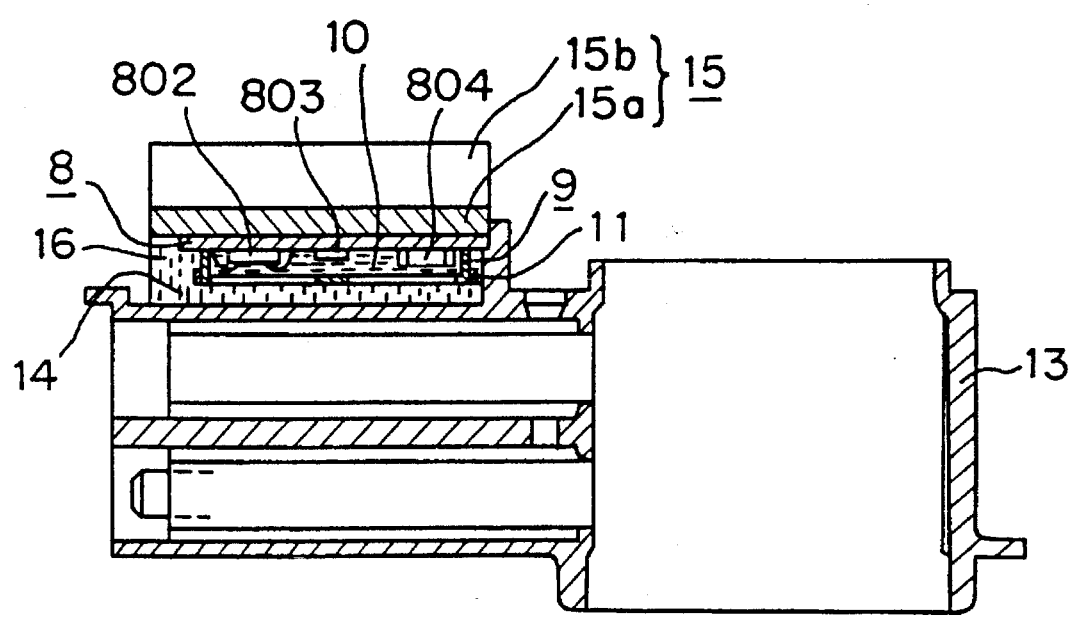
FIG. 14 is a sectional view along the line XI—XI of FIG. 13.

In FIGS. 13 and 14, reference numeral 13 designates a regulator case, reference numeral 14 designates a board housing part formed on the regulator case 13, reference numeral 15 designates a heat sink composed of a radiating plate 15a and a radiating fin 15b, and reference numeral 16 designates a sealing resin for sealing a board inside the board housing part 14 with the resin.

As described above, the hybrid integrated circuit devices of each of the aforementioned embodiments 1–3 can be incorporated in a voltage regulator for a motor car. That is to say, the devices can be housed in a case formed in a body with a brush holder (or a regulator case) which is made from resin, and consequently, the number of parts decreases and the formation of the case can easily done. Furthermore, because the protection resin 10 of the hybrid integrated circuit device and the sealing resin 16 are directly connected through the openings of the opened cover 11 in the incorporated state, the thermal stress of the protection resin 10 escapes to the outside through the sealing resin 16 to prevent any adverse the influence on the function elements.

While preferred embodiments of the present invention have been described using specific terms, such description is for illustrative purposes only, and it is to be understood that changes and variations may be made without departing from the spirit or scope of the following claims.

What is claimed is:

1. A hybrid integrated circuit device, comprising:
    a) an integrated circuit board (8),
    b) a plurality of electrical circuit components (802–804) individually mounted at least on one side of the board,
    c) an enclosing ring (9) disposed on said one side of the board and surrounding the circuit components,
    d) a protective resin (10) overlying the circuit components and filling a space defined by and within the ring up to an upper edge of the ring,
    e) means for preventing damage to the circuit components and electrical connections therebetween due to handling forces applied to an upper surface of the resin, said preventing means comprising a rigid, planar cover member fixed to said upper edge of the ring and overlying said upper surface of the resin, and
    f) means for relieving thermal stresses due to expansion and contraction of the resin, said relieving means comprising a plurality of open, uncovered apertures defined in and extending through the cover member to said upper surface of the resin.

2. The hybrid integrated circuit device according to claim 1, wherein said apertures are polygonal shaped.

3. The hybrid integrated circuit device according to claim 2, wherein said polygonal apertures are triangular.

4. The hybrid integrated circuit device according to claim 2, wherein said polygonal apertures are rectangular.

5. The hybrid integrated circuit device according to claim 1, wherein said apertures are one of circular and elliptic shaped.

6. The hybrid integrated circuit device according to claim 1, wherein said cover member is formed integrally with said ring.

7. The hybrid integrated circuit device according to claim 1, wherein said device is sealed in a voltage regulator housing for a motor car with a further, sealing resin.

* * * * *